United States Patent [19]

Kotachi et al.

[11] Patent Number: 5,326,670
[45] Date of Patent: Jul. 5, 1994

[54] PROCESS FOR FORMING RESIST PATTERN

[75] Inventors: Akiko Kotachi, Yokohama; Satoshi Takechi, Machida, both of Japan

[73] Assignee: Fujitsu Limited, Kawasaki, Japan

[21] Appl. No.: 711,779

[22] Filed: Jun. 7, 1991

[30] Foreign Application Priority Data

Jun. 8, 1990 [JP] Japan .................................. 2-150820

[51] Int. Cl.$^5$ .......................... G03F 7/30; G03F 7/012
[52] U.S. Cl. ..................................... 430/296; 430/167; 430/197; 430/271; 430/323; 430/326; 430/330; 430/942; 526/245; 526/248; 526/279
[58] Field of Search ............... 430/197, 167, 272, 296, 430/326, 942, 330, 323; 528/26, 28, 29, 42, 401, 320, 335; 526/245, 248, 279, 318.43, 329.7

[56] References Cited

U.S. PATENT DOCUMENTS

| | | | |
|---|---|---|---|
| 4,348,472 | 9/1982 | Jagt et al. | 430/296 |
| 4,365,049 | 12/1982 | Tsunoda et al. | 430/197 |
| 4,476,217 | 10/1984 | Douglas et al. | 430/296 |
| 4,686,168 | 8/1987 | Fujii et al. | 430/296 |
| 4,788,127 | 11/1988 | Bailey et al. | 430/197 |
| 5,066,751 | 11/1991 | Kotachi et al. | 526/279 |
| 5,068,169 | 11/1991 | Takechi et al. | 430/326 |
| 5,093,224 | 3/1992 | Hashimoto et al. | 430/296 |
| 5,153,103 | 10/1992 | Kotachi et al. | 430/296 |
| 5,192,643 | 3/1993 | Kotachi et al. | 430/296 |

FOREIGN PATENT DOCUMENTS

| | | |
|---|---|---|
| 0064864 | 11/1982 | European Pat. Off. . |
| 0379173 | 7/1990 | European Pat. Off. . |
| 60-254041 | 12/1985 | Japan .................................. 430/296 |

OTHER PUBLICATIONS

Patent Abstracts of Japan, vol. 9, No. 62, Mar. 19, 1985.
Patent Abstracts of Japan, vol. 13, No. 141, Apr. 7, 1989.
Patent Abstracts of Japan, vol. 9, No. 308, Dec. 4, 1985.

Primary Examiner—Charles L. Bowers, Jr.
Assistant Examiner—John S. Chu
Attorney, Agent, or Firm—Nikaido Marmelstein Murray & Oram

[57] ABSTRACT

A resist composition for forming a upper resist layer and a process for forming a pattern thereby are disclosed. This resist comprises an azide compound and a polyacrylic copolymer of the following formula (1):

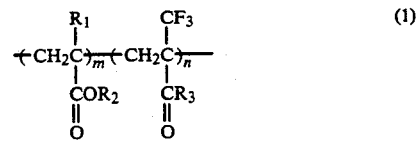

wherein,
$R_1$ means $CH_3$, $CF_3$, $CN$, $CH_2OH$, or $CH_2CO_2R$, wherein R means an alkyl having 1 to 5 carbon atoms
$R_2$ means a hydrocarbon radical having at least one Si,
$R_3$ means $OH$, $O-C(CH_3)_3$, $NH_2$, or $NHCH_2OH$, and, a ratio of n to m is more than 0 and is 1 or less than 1.

Whereby a finely-resolved resist pattern is obtained by a preset process for forming the resist pattern.

4 Claims, 3 Drawing Sheets

PROCESS FOR FORMING RESIST PATTERN

BACKGROUND OF THE INVENTION

1. Field of the Invention

The present invention relates to a positive-working resist composition for use in double layer resist processing.

2. Description of the Related Art

Due to the necessity for treating a large amount of information at a high speed an integrated semiconductor device, which plays a main role in an information treating device, has been developed and large-scale integrated circuits (LSI) and very large-scale integrated circuits (VLSI) are now in practical use.

This integration is carried out by a miniaturization of unit elements and the use of a minimum line spacing of the wiring pattern on an order of submicrons, and further, a multi-layer wiring process is carried out. Therefore, many minute steps are formed on a semiconductor wafer when producing integrated circuits.

When manufacturing a semiconductor integrated circuit, a resist is coated on the semiconductor substrate, and then selectively exposed and developed to dissolve the exposed portions or unexposed portions, and finally, a through hole is formed. Thereafter, a photo-etching technique (photolithography or electron-beam lithography) is conducted, whereby a conductive film or an insulating film is etched by dry-etching.

Therefore, as a process for precisely forming a fine pattern while neglecting the influence of the steps, a multi-layer resist having a double-layer or triple-layer structure has been employed. Especially, a double-layer resist process having fewer process steps is generally employed.

In a double-layer resist process, a novolac resist is coated on a substrate having steps, as a lower-layer resist providing a level surface, followed by coating a upper-layer resist thereon, which resist has an oxygen-plasma resistance and a high resolution.

Many kinds of double-layer resist have been proposed, but an electron-beam resist which can provide a resolution on an order of sub-microns has not been developed.

As a positive resist having a superior oxygen-plasma resistance, a copolymer having the following formula (1) was proposed by the present inventors (see Japanese Application No. 2-61552).

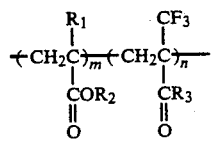  (1)

wherein,
  $R_1$ means $CH_3$, $CF_3$, $CN$, $CH_2OH$, or $CH_2CO_2R$, wherein R means an alkyl having 1 to 5 carbon atoms
  $R_2$ means hydrocarbon group having at least one Si,
  $R_3$ means OH, O—C($CH_3$)$_3$, $NH_2$, or $NHCH_2OH$, and, a ratio of n to m is more than 0 and is 1 or less than 1.

The molecular weight of the copolymer is from 20,000 to 1,500,000.

A cross-linking of this resin at the $R_3$ position is caused by heating, but since it is necessary to enlarge the ratio of a-substituted acrylate having Si as a copolymer to improve the oxygen-plasma resistance, the cross-linking density becomes too low. Accordingly, the resolution is poor, and thus it is difficult to produce a fine pattern of 0.5 μm or less.

It is difficult to resolve the sub-micron pattern for the resist of the above formula (1).

Therefore, there is a need to improve the resolution to make it possible to produce a 0.5 μm or less pattern.

SUMMARY OF THE INVENTION

The above problems can be solved by an invention of the present resist composition which comprises an azide compound and a copolymer expressed by the following formula (1):

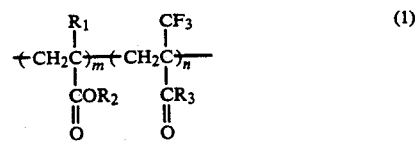  (1)

wherein,
  $R_1$ means $CH_3$, $CF_3$, $CN$, $CH_2OH$, or $CH_2CO_2R$, wherein R means an alkyl having 1 to 5 carbon atoms
  $R_2$ means a hydrocarbon radical having at least one Si,
  $R_3$ means OH, O—C($CH_3$)$_3$, $NH_2$ or $NHCH_2OH$, and, a ratio of n to m is more than 0 and is 1 or less than 1.

Typical examples of the radical of $R_2$ in the copolymer expressed by the formula (1) are as follows:
$(CH_2)_n SiMe_3$  n=0–5,
$(CH_2)_n CH(Me)—SiMe_3$  n=0–5,
$(CH_2)_n C(Me)_2—SiMe_3$  n=0–5,
$(CH_2)_n Si(C_6H_5)Me_2$  n=0–3,
$(CH_2)_n Si(C_6H_5)_2 Me$  n=0–3,
$(CH_2)_n Si(C_6H_5)_3$  n=0–3, and
$(CH_2)_n Si(Me)_2—CH_2—SiMe_3$  n=0–3.

The molecular weight of the above copolymer is from 20,000 to 1,500,00.

Note, in a preferred embodiment of the above copolymer, a ratio of m: n is such that the silicon content in the copolymer is more than 10%.

In the present resist composition, the copolymer is preferably produced by the procedure described in Japanese Patent Application No. 2-61552, and the azide compound can be obtained commercially.

The above problems can be solved by the invention of the present process for forming the resist pattern, which comprises the steps of:
  coating an substrate to be fabricated with a resist to form a lower resist layer thereon;
  coating the lower resist layer with a resist composition comprising a above-mentioned copolymer of the formula (1) and an azide compound;
  heating the substrate to cause a cross-linking in the upper resist layer;
  exposing the resist layer to a predetermined pattern of radiation to form a latent image in the resist layer corresponding to the radiation pattern, and
  developing the pattern-wise exposed resist with a developer to form an upper resist pattern.

DESCRIPTION OF THE PREFERRED EMBODIMENTS

Figure 1A:
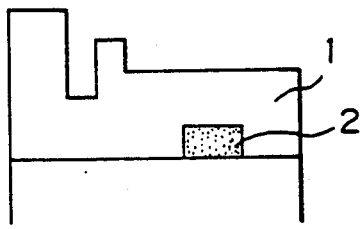
FIGS. 1A through 1H are sectional views showing the sequence of steps in one embodiment of the present invention.

In the present invention, the copolymer of the general formula (1) is added to the azide compound to form the resist composition. The cross-linking density of the copolymer can be increased by a heat treatment.

Conventionally, the copolymer of the formula (1) is heated (baked) to cause a cross-linking, while splitting the radical of $R_3$ such as OH, and $NH_2$ off at the $R_3$ position.

In the present composition, an azide compound is added to the copolymer of the formula (1) and heated (hard-baked) at a temperature higher than a decomposition temperature of the azide compound but lower than a decomposition temperature of the copolymer of the formula (1), to thereby increase the cross-linking density, while forming the cross-linkage at a position other than the $R_3$ position.

The present composition is usually heated at a temperature of more than 130° C., preferably at a temperature of more than 180° C.

Namely, in the present invention, the copolymer of the formula (1) is added to any of the azide compounds listed below, to form the resist composition, and thus-obtained composition is heated to cause the cross-linking of the copolymer, whereby the insolubility thereof in a solvent is increased.

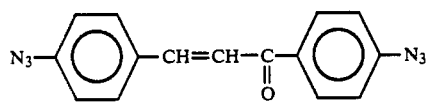
(2)

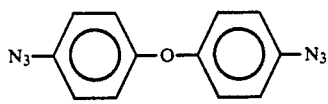
(3)

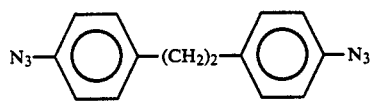
(4)

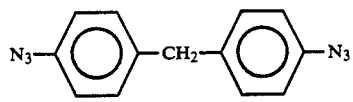
(5)

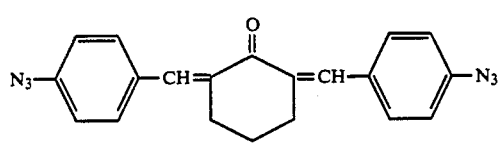
(6)

and

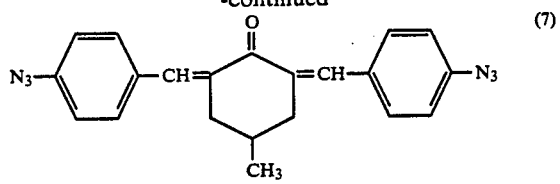
(7)

Further, when the highly cross-linked copolymer is subjected to an electron beam radiation, the main chain is broken and becomes soluble in a solvents, as in the prior art.

Note, the azide compound is decomposed by the above heat-treatment.

The addition ratio of the azide compound to the copolymer is preferably 0.1 to 30% by weight, as proven by experiments.

This is because, if the addition ratio is less than 0.1%, the desired results cannot be obtained, and if the addition ratio is more than 30%, the molecular weight becomes too large due to a high cross-linking, so that a complete decomposition cannot be attained even by an electron beam radiation, and therefore, a positive resist pattern cannot be obtained.

As disclosed above, the present invention makes the polymer in the unexposed region insoluble, and thus a strong developing agent such as methyl isobutyl ketone (MIBK) can be utilized, and a resolution of a submicron pattern can be obtained.

The invention will be more clearly understood with reference to the following examples.

EXAMPLE 1

As the copolymer of the general formula (1), the following copolymer (M.W.=$55 \times 10^4$) of the formula (8) was employed.

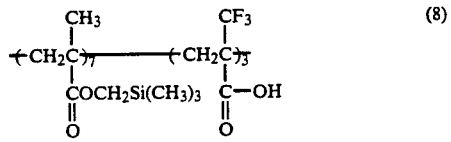
(8)

Also, as an azide compound, 4,4'-diazide chalcone of the formula (2) was used and this azide was added to the copolymer at the ratio of 5 weight% based on the polymer, then mixed with a MIBK solution at a ratio of 50 grams/l to form a resist.

This resist was coated on a silicon wafer to a thickness of about 3000 Å, then heated on a hot plate for eight minutes at 220° C.

Thereafter, the formed resist film was exposed to an electron beam with an accelerated voltage of 20 KeV, and developed for three minutes in MIBK, 0.4 micron patterns were resolved. The sensitivity (E th) was 14.4 $\mu C/cm^2$.

EXAMPLES 2-7

As a copolymer component, the copolymer of the formula (8) was used, and as an azide compound, the compounds of the formulas (3) to (7) were respectively used, to obtain a resist in the same way as in Example 1. The thus obtained resist was coated on a silicon wafer to a thickness of about 3000 Å and a similar procedure as in Example 1 effected, to obtain similar effects.

EXAMPLE 8

As a copolymer component, the copolymer (M.W.=12×10⁴) of the following formula (9) was used:

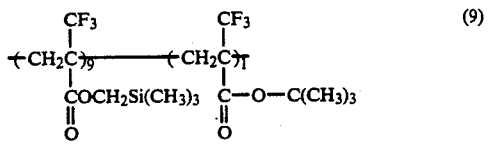

Also, as an azide compound, 4,4'-diazide chalcone of the formula (2) was employed, and five % by weight based on the copolymer of the azide compound was mixed with the copolymer to form a resist in the same way as in Example 1.

The thus obtained resist was coated on a silicon wafer to a thickness of 3000 Å, followed by heating on a hotplate for eight minutes at a predetermined temperature.

Then, the resist layer was exposed to an electron beam at an accelerated voltage of 20 KeV, and developed for three minutes in MIBK, 0.3 micron patterns were resolved. The sensitivity (E th) was 11.2 $\mu C/cm^2$.

EXAMPLE 9

As a copolymer, the copolymer (M.W.=24×10⁴) of the following formula (10) was used:

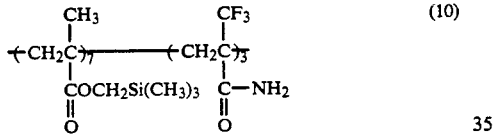

As an azide compound, 4,4'-diazide chalcone was used.

In accordance with the procedure described in Example 1, a finely resolved pattern of 0.45 $\mu$m having a sensitivity (E th) of 16.0 $\mu C/cm^2$ was obtained.

EXAMPLES 10-14

As a copolymer, the copolymer of the formula (9) was used and as a diazide compound, the compounds of the formulas (3) through (7) were respectively used to form a resist.

Using the same procedure as described in Example 1, a sub-micron pattern was obtained.

EXAMPLES 15-19

As a copolymer, the copolymer of the formula (10) was used, and as a diazide compound, the compounds of the formulas (3) through (7) were respectively used to form a resist.

Using the same procedure as described in Example 1, a sub-micron pattern was obtained.

EXAMPLE 20

Figure 1B:
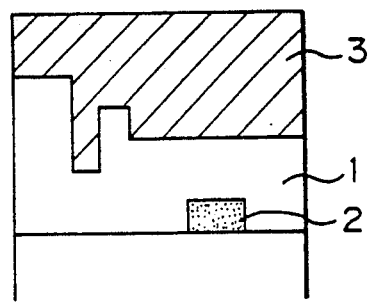

A novolac-type photo resist (manufactured by Nagase Sangyo Co., Ltd.) 3was coated to a thickness of 2.0 $\mu$m on a substrate 1, with a step having an aluminum wire 2 therein (FIG. 1A, FIG. 1B), and baked at a temperature of 220° C. in an oven to form a lower resist layer.

Figure 1C:
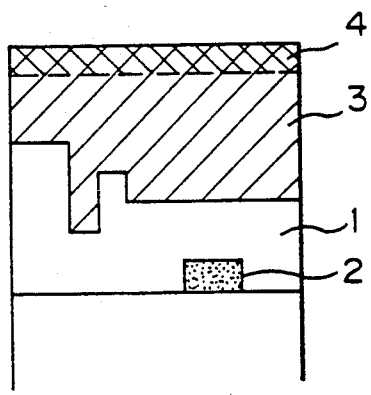

Then, a 30 g/l MIBK resist solution 4 for an upper layer comprising the copolymer of the formula (8) and 5 weight % of 4,4'-diazide chalcone was coated on the substrate 1 (FIG. 1C), followed by baking at a temperature of 220° C. on a hot plate for eight minutes.

Figure 1D:
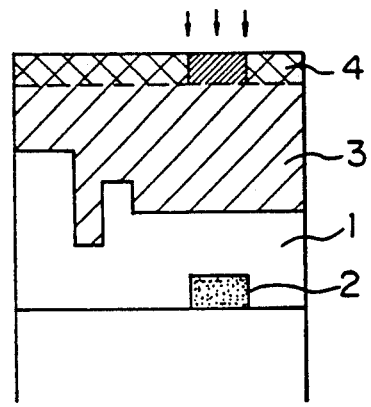
Figure 1E:
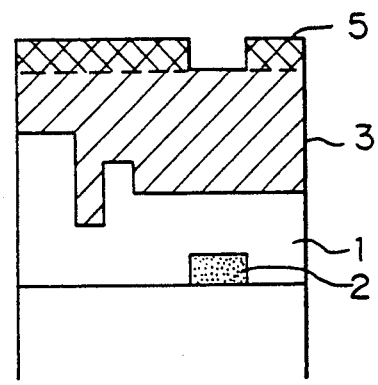

The thus formed resist layer was exposed to an electron beam at an accelerated voltage of 20 KeV to form a 0.4 $\mu$m line and space pattern (FIG. 1D), which was developed in MIBK for two minutes to obtain an upper resist pattern 5 (FIG. 1E). This upper resist layer was resistant to oxygen plasma.

Figure 1F:
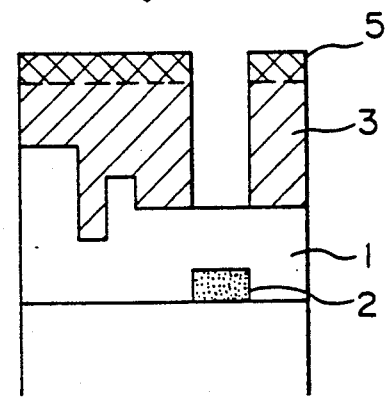

The lower resist layer was etched by oxygen-reactive ion etching (RIE) using the thus-obtained upper resist layer as a mask, to form a 0.4 $\mu$m line and space lower resist pattern (FIG. 1F).

Figure 1G:
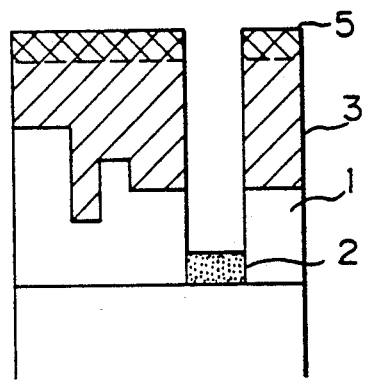
Figure 1H:
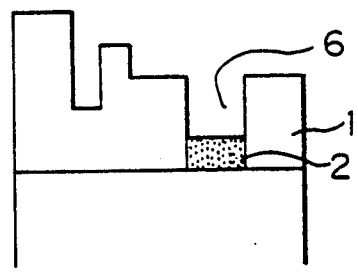

The substrate 1 was dry-etched using the upper and lower resists layers as a mask (FIG. 1G), followed by removing both resist layers to obtain a contact hole 6 (FIG. 1H).

EXAMPLES 21-22

The compounds of the formulas (9) and (10) were respectively used, and a similar procedure as described in Example 1 was carried out, whereby a finely figured-pattern was transferred to a lower resist layer.

We claim:

1. A process for forming a multilevel resist pattern, which comprises steps of:
   coating a semiconductor substrate to be fabricated with a resist to form a lower resist layer thereon;
   coating the lower resist layer with a resist composition comprising an azide compound and a copolymer of the formula ( 1 ):

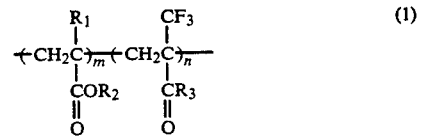

wherein,
   $R_1$ means $CH_3$, $CF_3$, CN, $CH_2OH$, or $CH_2CO_2R$, wherein R means an alkyl having 1 to 5 carbon atoms
   $R_2$ means a hydrocarbon radical having at least one Si,
   $R_3$ means OH, O—C(CH$_3$)$_3$, NH$_2$, or NHCH$_2$OH, and, a ratio of n to m is more than 0 and is 1 or less than 1, to form an upper resist layer thereon,
   heating the substrate to cause a cross-linking in the said upper resist layer,
   exposing the resist to a predetermined pattern of high energy radiation to form a latent image in the resist layer corresponding to the radiation pattern, and
   developing the pattern-wise exposed resist layer to selectively remove the exposed areas of the resist with a developer to form an upper resist pattern.

2. A process according to claim 1, wherein prebaking is carried out after coating the lower resist on the article to be fabricated.

3. A process according to claim 1 or 2, wherein the heat treatment is carried out at a temperature higher than a decomposition temperature of the azide compound and lower than a decomposition temperature of the copolymer.

4. A process according to claim 1, wherein the heat treatment of the upper resist layer is carried out at a temperature of more than 130° C.

* * * * *